United States Patent [19]

Chao

[11] Patent Number: 5,354,701
[45] Date of Patent: Oct. 11, 1994

[54] DOUBLED STACKED TRENCH CAPACITOR DRAM AND METHOD OF FABRICATING

[75] Inventor: Fung-Ching Chao, Hsinchu, Taiwan

[73] Assignee: Industrial Technology Research Institute, Hsinchu, Taiwan

[21] Appl. No.: 687,055

[22] Filed: Apr. 18, 1991

[51] Int. Cl.$^5$ ............................................. H01L 27/00
[52] U.S. Cl. ...................................... 437/52; 437/54; 437/47; 437/48
[58] Field of Search ............... 437/47, 48, 52, 40, 437/38, 20, 16; 357/23.6 G

[56] References Cited

U.S. PATENT DOCUMENTS 4,877,750 10/1989 Okumura ........................ 437/52

FOREIGN PATENT DOCUMENTS

| 0258952 | 12/1985 | Japan | 357/23.6 G |
| 0005572 | 1/1986 | Japan | 357/23.6 G |
| 0229745 | 9/1988 | Japan | 357/23.6 G |
| 2138207 | 10/1984 | United Kingdom | 437/48 |

*Primary Examiner*—R. Bruce Breneman
*Attorney, Agent, or Firm*—George O. Saile; Wolmar J. Stoffel

[57] ABSTRACT

A process of fabricating a double stacked trench capacitor DRAM cell and resulting DRAM cell is described. The process begins by forming a trench in a semiconductor substrate. A first insulating layer is formed on the top surface of the substrate and on the sidewalls and bottom of the trench. A first contact opening is formed in the first insulating layer. A first polysilicon layer is formed and patterned to overlay the trench surface and a portion on the surface that extends into the contact opening. An insulating layer is formed over the first polysilicon layer. A second polysilicon layer is formed and patterned over the first polysilicon layer. An insulating layer is formed over the second polysilicon layer. A second contact opening is formed in the first insulating layer. A third polysilicon layer is formed over the second polysilicon layer and a portion extending into the second contact opening. A pair of FETs are formed with the drain regions in contact with the respective first and third polysilicon layers through the contact openings. A metallurgy system is formed wherein the gate electrodes of the FETs are joined to word lines, and the source regions are joined to bit lines of the supporting device.

17 Claims, 5 Drawing Sheets

DOUBLED STACKED TRENCH CAPACITOR DRAM AND METHOD OF FABRICATING

BACKGROUND OF THE INVENTION (1) Field of the Invention

This invention relates to an improved dynamic random access memory cell having an improved trench capacitor that can provide the required capacitance while occupying less surface space, and to a method of fabricating the improved cell.

(2) Description of the Prior Art

In the last decade, semiconductor memories have been the fastest growing segment of the semiconductor industry, with the large expansion due to the rapid growth of the digital electronics market with increasing applications. Of the various types of semiconductor memories, dynamic random access memories (DRAMS) have been produced in the largest quantities because of their high density, low cost, and high performance. An important contribution is the transistor memory cell, which uses a capacitor for storing different amounts of charge to represent different binary logic states. The simple schematic diagram of such a cell utilizing a trench capacitor is illustrated in FIG. 1 of the drawings. The gate electrode 10 of FET 12 is connected by a suitable metallurgy system to the word line of a supporting device. The source 14 of transistor 12 is connected to a bit line, and the drain is connected to electrode 18 of capacitor 20, which is shown located in a trench in order to conserve surface area. Suitable isolation 22 is provided to electrically isolate the cells on the device from each other.

As each new generation of memories has evolved, the chip density has roughly quadrupled. This density increase has been achieved by new and innovative cell designs. Operating requirements and design constraints have in general required that the cell capacitor should store enough charges to prevent noise problems. Since the storage charge capacity of a capacitor is largely dependent on the area of the capacitor elements, new capacitor designs seek to utilize the vertical dimensions of the device by placing the capacitors on the surface in overlying relationship to the device elements, or to bury them in trenches. There is a pressing need in the semiconductor memory technology to shrink the area that the cell occupies on the wafer to increase the chip density, and yet achieve basically the some storage capacity.

SUMMARY OF THE INVENTION

An object of the invention is to provide a new DRAM cell having a capacitor that occupies less area on the device, thereby permitting higher cell density.

Another object of the invention is to provide a new method for producing a DRAM cell with a capacitor that occupies less area on the device then similar structure of the prior art.

Yet another object of the invention is to provide an improved trench capacitor for a DRAM cell and a method of producing the capacitor.

In accordance with the above objects, there is presented a process of fabricating a double stacked trench capacitor DRAM cell by forming a trench in a semiconductor substrate, forming a first insulating layer on the top surface of the substrate and on the sidewalls and bottom of the trench, forming a first contact opening in the first insulating layer, forming and patterning a first polysilicon layer to overlay the trench surface and a portion on the surface that extends into the contact opening, forming an insulating layer over the first polysilicon layer, forming and patterning a second polysilicon layer over the first polysilicon layer, forming an insulating layer over the second polysilicon layer, forming a second contact opening in the first insulating layer, forming a third polysilicon layer over the second polysilicon layer and a portion extending into the second contact opening, forming a pair of FETs with the drain regions in contact with the respective first and third polysilicon layers through the contact openings, and forming a metallurgy system wherein the gate electrodes of the FETs are joined to word lines, and the source regions are joined to bit lines of the supporting device.

In addition, there is presented a pair of double stacked trench capacitor DRAM cells including a semiconductor substrate provided with a lined trench, a pair of capacitors positioned in the trench and associated with an FET, the capacitors comprised of a first capacitor with a first polysilicon layer forming an electrode and an insulating layer lining the sidewalls and bottom of the trench and joined to the drain region of the first FET, and a second capacitor with a third polysilicon layer forming an electrode, and an overlying insulating layer, positioned in parallel relation to the first polysilicon layer and joined to the drain region of the second FET, and a second polysilicon layer with an overlying layer positioned intermediate to the first and third polysilicon layers.

DETAILED DESCRIPTION OF THE PREFERRED EMBODIMENTS

Figure 1:
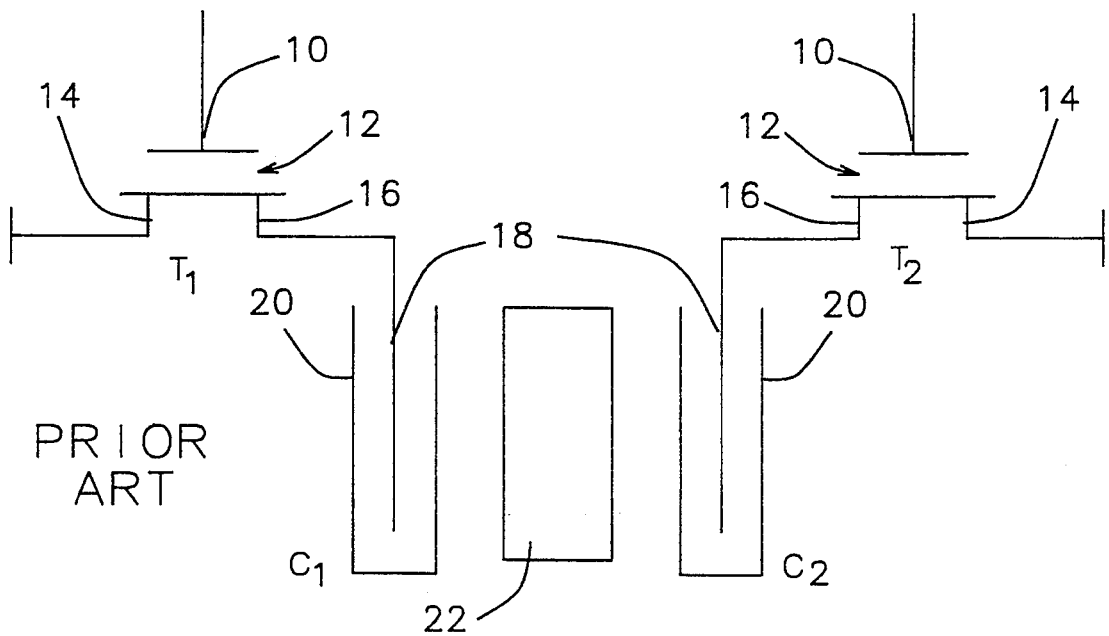
FIG. 1 is a schematic of a pair of DRAM cells with individual trench capacitors arranged in a manner known to the prior art.
Figure 2:
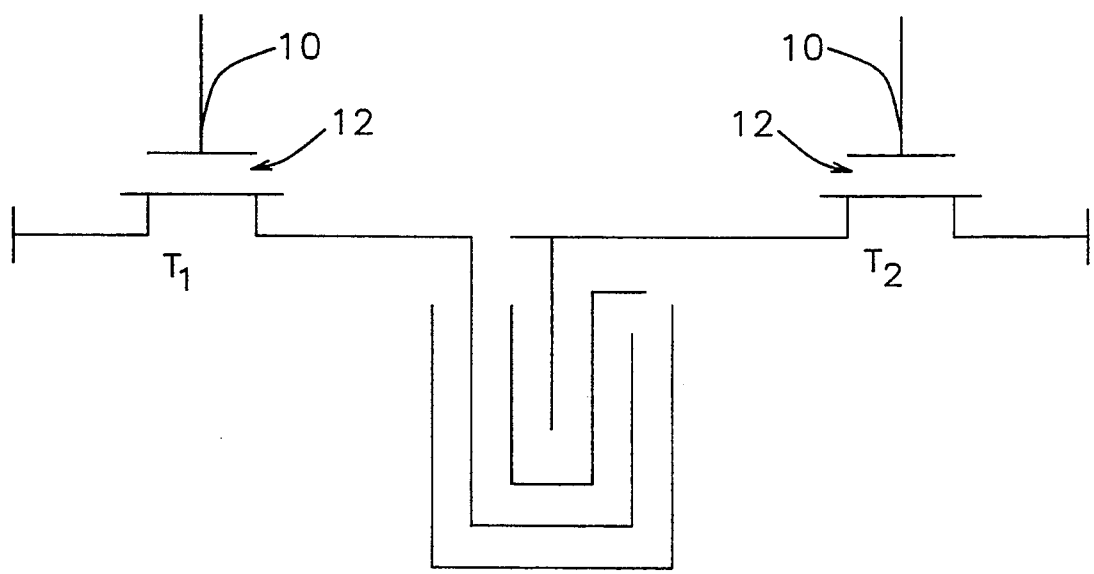
FIG. 2 is a schematic of a pair of DRAM cells with the trench capacitors in a single trench and arranged in the mode of the invention.

Referring now to the drawings, the basic improvement of this invention over the prior art is illustrated in FIG. 2. The closest prior art is believed shown in FIG. 1, which shows a pair of DRAM cells, each with a trench capacitor 20 located in individual trenches in the substrate. In FIG. 2 there is shown a pair of DRAM cells, each with the same basic elements i.e. an FET 12, and a capacitor. However, the capacitors 20 are shown nested together in a single trench. This concept permits a reduction in the device area allotted to the capacitor element, thereby making possible an increase in chip density on the memory device. At the same time, the isolation between capacitors is also merged into the triple polycrystalline silicon trench structure, that is the common plate of capacitors also electrically isolates these two capacitors. This feature further increases chip density.

Figure 3:
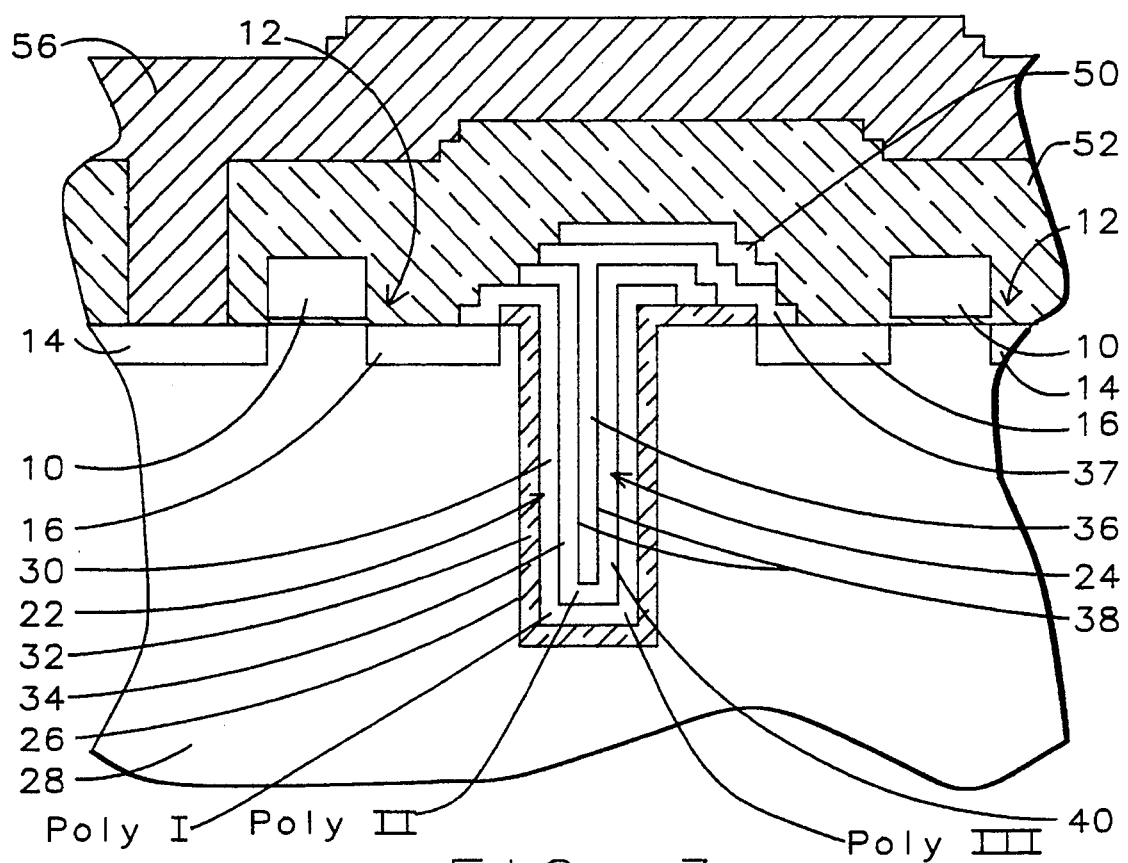
FIG. 3 is a cross sectional view of a pair of DRAM cells with a double stacked trench capacitor of the invention.
Figure 4:
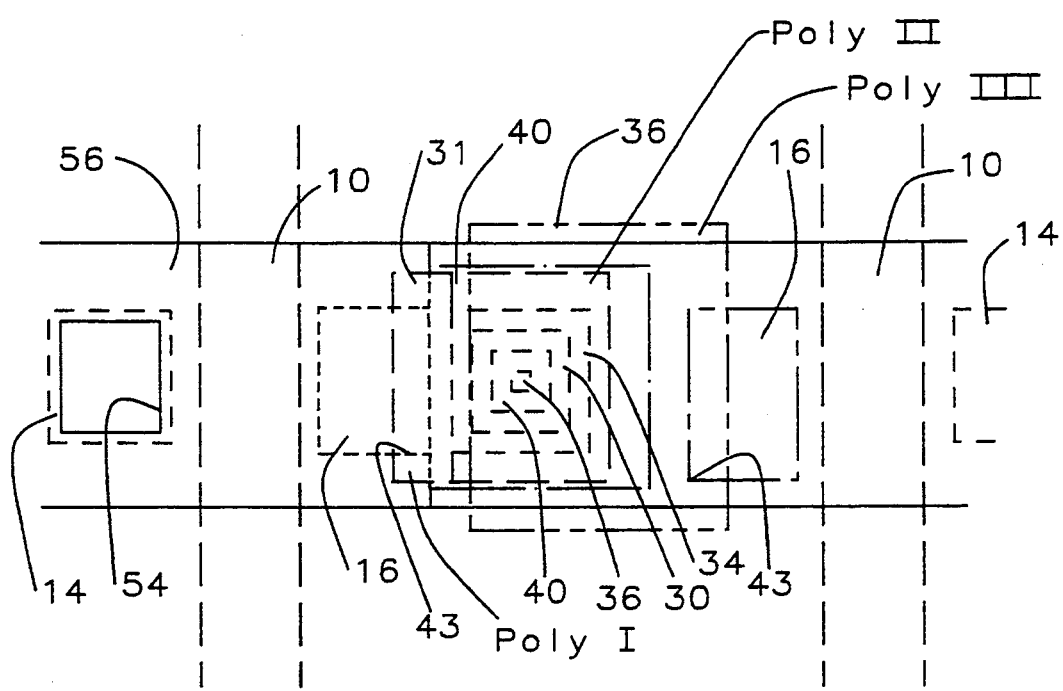
FIG. 4 is a top elevational view of the cells shown in FIG. 3.

The specific structure of applicant's inventions is shown more clearly in FIGS. 3 and 4. Again there is shown an adjoining pair of DRAM cells that are in practice a part of a memory device that has many individual memory cells. Each cell has an FET 12 having a gate electrode 10, a source region 14 and a drain region 16. A trench 26 in semiconductor substrate 28 contains a pair of capacitors 22 and 24 which are operationally connected to the respective FET 12. The cells of the device are isolated from each other by suitable isolation (not shown) which is well known in the art and is not considered to be a part of the invention. Capacitor 22 has an electrode 30 formed of a first conductive polysilicon layer that is electrically connected to drain region 16 of the FET 12 by lead 31. The electrode 30 is electrically isolated on one side by an insulating layer 32 that lines the trench 26, and on the other side by a thin insulating layer 34. Capacitor 24 has a electrode 36 formed of a third conductive polysilicon layer that is electrically connected to the drain region 16 of the opposite FET 12 by lead 37. Electrode 36 is electrically isolated by a thin insulating layer 38. Positioned between insulating layers 34 and 38 is a second conductive polysilicon layer 40. The gate electrodes 10 are electrically connected to word lines of the memory device, and source regions 14 is electrically connected to a bit line 42. Layer 40 of cell pairs are connected to each other by the unremoved portions of the second conductive polysilicon layer across the isolation region during the process, and is connected to a voltage source in real circuit applications.

Figure 5:
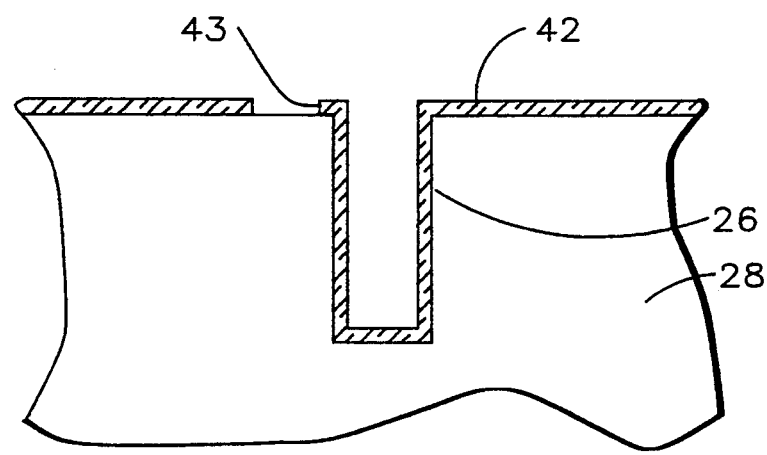
FIGS. 5 through 12 are a sequence of crossectional views that illustrate the process of the invention for fabricating a pair of double stacked trench capacitor DRAM cells.

Referring more particularly to FIGS. 5 through 12 there is shown a sequence of drawings that illustrate the main steps for fabricating the pair of DRAM cells of the invention. After isolation stripe structure is formed, as indicated in FIG. 5 a trench 26 is formed in semiconductor substrate 28, preferably by reactive ion etching. The trench size is consistent with the device geometry requirements, and the size of the desired capacitor elements. Typically the trench area will be in the range of 0.5×0.5 to 1×1 micrometers squared, more preferably on the order of 0.8×0.8 micrometers squared. The depth of the trench should be in the range of 4 to 10 micrometers, more preferably on the order of 6 micrometers. After the trench 26 has been formed, an insulating layer 42 is formed or deposited on the surface of the device 28 and also on the bottom and sidewalls of trench 26. This layer is preferably a layer of silicon dioxide with a thickness in the range of 500 to 2000 Angstroms, formed by chemical vapor deposition. Other suitable materials for layer 26 are plasma enhanced silicon dioxide, TEOS deposited silicon dioxide or thermal silicon dioxide. A contact opening 43 is made in layer 42 which is located adjacent to trench 26.

Figure 6:
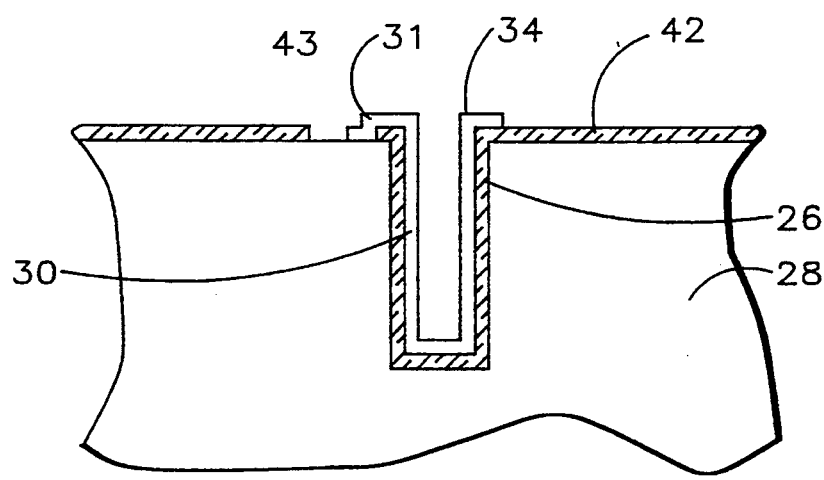

As shown in FIG. 6 a first layer 30 of polysilicon is deposited on substrate 28 and subsequently patterned to leave a polysilicon layer on the bottom and sidewalls of trench 26 and also a contact portion 31 that extends into contact opening 43 in electrical contact with substrate 28. The polysilicon layer 30 has a thickness in the range of 500 to 2000 Angstroms, more preferably on the order of 1000 Angstroms. Layer 30 is formed by using conventional low pressure chemical vapor deposition polysilicon followed by (POCl$_3$) phosphorus oxychloride doping process, or by using in-situ doped polysilicon deposition method. A thin insulating layer 34 is deposited on the surface of layer 30 to function as the capacitor dielectric. The thin insulating layer 34 is preferably a composite layer of Silicon Oxide, an intermediate layer of Silicon Nitride, and a second overlying layer of Silicon Oxide. These layers can be formed by conventional (ONO) silicon dioxide/silicon nitride/silicon dioxide dielectric forming process. The overall thickness of composite layer 34 is in the range of 70 to 200 Angstroms, more preferably on the order of 100 Angstroms. Alternately, layer 34 can be a layer of silicon oxide, such as silicon dioxide formed by oxidizing the polysilicon layer 30. The oxidation can preferably be achieved by an appropriate oxidation furnace.

Figure 7:
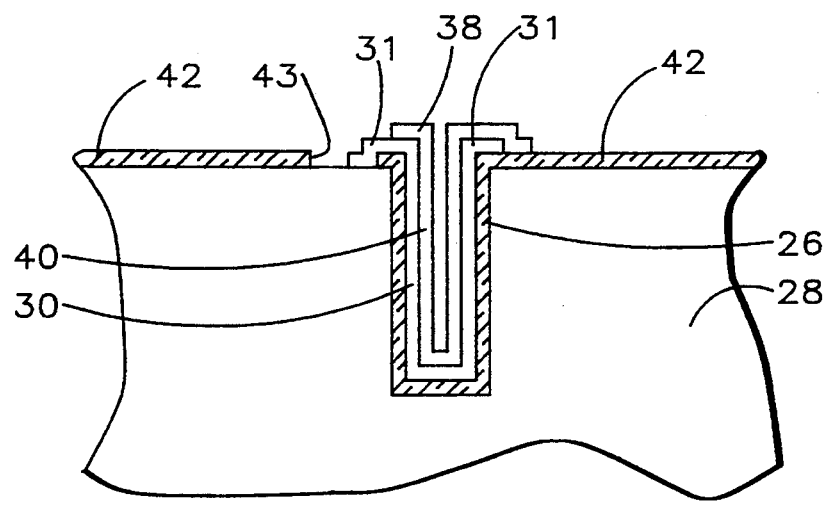

As shown in FIG. 7 a second polysilicon layer 40 is deposited over polysilicon layer 30 and insulating layer 34, and patterned. A thin insulating layer 38 is formed on the surface of layer 40, which is similar to the thin insulating layer 34, described previously.

Figure 8:
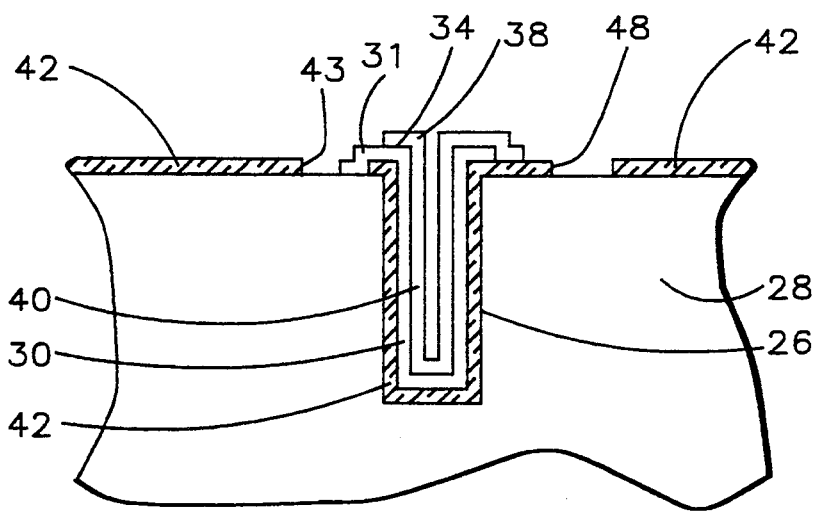

As shown in FIG. 8 a second contact opening 48 is formed in layer 42 that is on the opposite side of trench 26 from opening 43.

Figure 9:
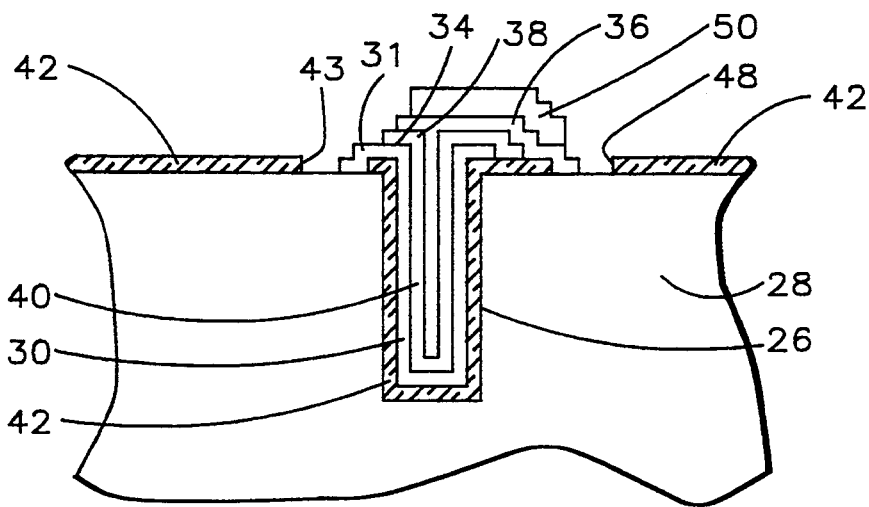

As shown in FIG. 9, a third polysilicon layer 36 is deposited over polysilicon layer 40 and overlying thin layer 38 and patterned. Note that layer 36 essentially fills the remaining opening in trench 26, and also extends into contact opening 48. Polysilicon layer 36 has essentially the same thickness of layers 30 and 40, and is deposited in the same manner previously described.

In real memory array, there will be a polysilicon word line across over trench area, so it is necessary to put an insulating layer between polysilicon III and polysilicon word line. Meanwhile, this insulating layer is attacked during the layer 42 removing process. Generally, the insulating layer 50, preferably chemical vapor deposition silicon dioxide, is deposited thicker than layer 42, and is a portion thereof remains after layer 42 is removed.

Figure 10:
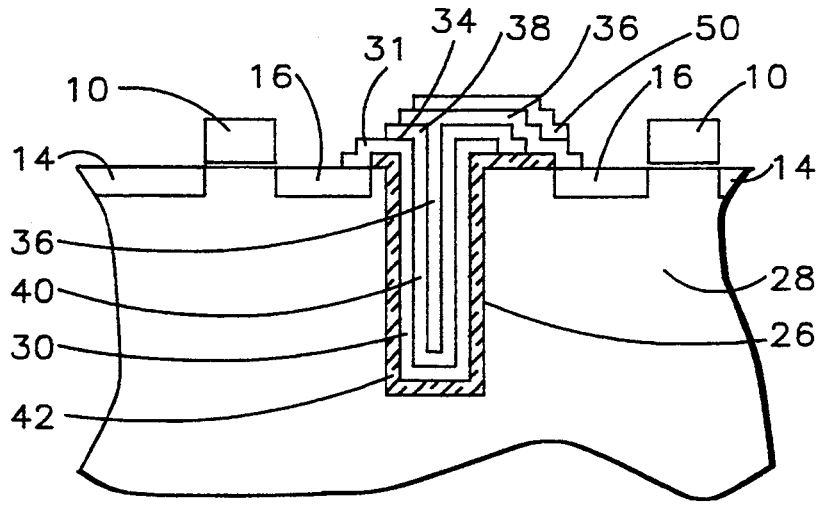

As shown in FIG. 10 the exposed portions of layer 42 are removed, a gate dielectric layer, and a gate 10 layer is deposited and patterned. Subsequently dopants are introduced into the substrate 28 by ion implantation techniques, using standard self alignment processes, to form source 14 and drain regions 16. As mentioned, the gate electrodes constitute a part of the word lines.

In fact, the drain region is not necessarily the same in depth throughout, because dopants of the junction region under 31 are penetrating from layer polysilicon I, 30 through direct contact area 31 into the drain region 16 during subsequent thermal processing. That is, there are differences in depths from regions formed by ion implantation processing. The differences in depth are, however small and these differences are not shown in the drawings.

Figure 11:
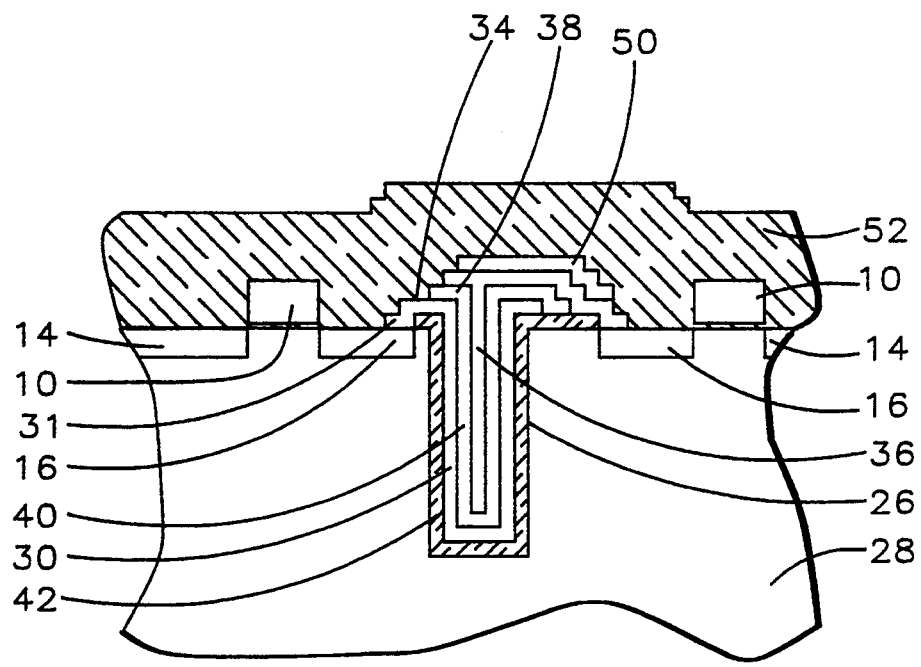
Figure 12:
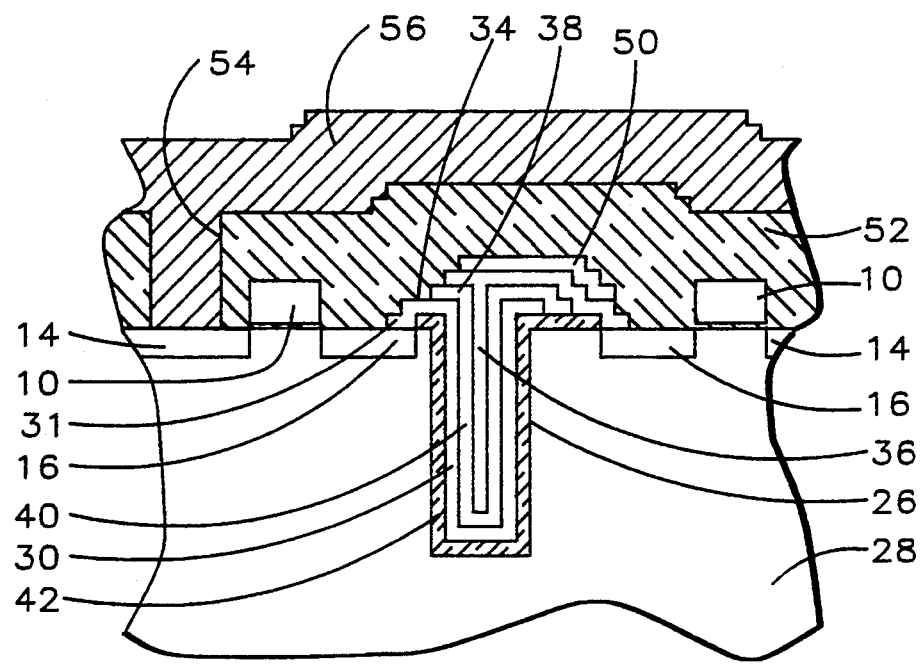

As shown in FIG. 11, an insulating layer 52 is deposited on the surface of substrate 28. Layer 52 is preferably silicon dioxide, formed by chemical vapor deposition. As shown in FIG. 12, an opening 54 is made in layer 52 over the source region 14, and a metallurgy layer 56 deposited and patterned to form the metallurgy system of the device.

The cells are isolated from each other by isolation between two capacitors in the same trench. The cell pairs are isolated from one another by field isolation stripe structures formed by the well-known isolation techniques.

While the invention has been particularly shown and described with reference to the preferred embodiments thereof, it will be understood by those skilled in the art, that various changes in form and details may be made without departing from the spirit and scope of the invention.

What is claimed is:

1. A method of producing a pair of DRAM cells each having a capacitor located in a common shared trench comprising, forming a trench in a monocrystalline semiconductor substrate, forming a first insulating layer on the top surface of said semiconductor substrate and on the sidewalls and bottom surfaces of said trench, forming a first contact opening in said first insulating layer on the top surface of said semiconductor substrate that is adjacent said trench, forming a first polysilicon layer on the surface of said semiconductor substrate over said first insulating layer, patterning said first polysilicon layer to leave a polysilicon layer on at least the sidewalls and bottom or said trench, and a contact portion to said first contact opening, form an insulating layer over said first polysilicon layer, forming and patterning a second polysilicon layer over said first polysilicon layer, forming an insulating layer over the surface of said second polysilicon layer, forming a second contact opening in said first insulating layer space from said trench and opposite said first contact opening, forming and patterning a third polysilicon layer over said second polysilicon layer and a portion extending into said second contact opening, forming a gate electrode adjacent said first polysilicon contact portion in said first contact opening, and a second gate electrode adjacent said third polysilicon contact portion in said second contact opening, introducing dopants into said semiconductor substrate on opposite sides of said gate electrodes to form source and drain regions, each of said first and said second gate electrode, and the associated source and drain regions, constituting a FET device of a cell, forming an interconnecting metallurgy system that joins said gate electrodes to word lines and said source regions to bit lines of a DRAM device, said first polysilicon layer forming the electrode of a capacitor for the associated FET and said third polysilicon layer forming the electrode of a capacitor for the associated FET.

2. The method of claim 1 wherein said trench is formed in said substrate by reactive ion etching techniques.

3. The method of claim 2 wherein the area of said trench is in the range of $0.5 \times 0.5$ to $1.0 \times 1.0$ micrometers squared.

4. The method of claim 3 wherein the depth of said trench is in the range of 4 to 10 micrometers.

5. The method of claim 2 wherein said first insulating layer on the substrate is silicon oxide formed by vaporizing $Si(OC_2H_5)_4$ in a low pressure chemical vapor deposition reactor at a temperature in the range of 650° to 750° C.

6. The method of claim 5 wherein said first insulating layer has a thickness in the range of 500 to 2000 Angstroms.

7. The method of claim 3 wherein said first contact opening is spaced from said trench a distance on the order of 0.1 micrometers.

8. The method of claim 1 wherein the thickness of the first, second and third polysilicon layers is in the range of 500 to 2000 Angstroms.

9. The method of claim 8 wherein the thickness of the first, second and third polysilicon layers in on the order of 0.1 micrometers.

10. The method of claim 9 wherein said insulating layers on said first, and said second polysilicon layers is a composite layer of silicon oxide, silicon nitride, and silicon oxide.

11. The method of claim 9 wherein said insulating layers on said first and said second polysilicon layers is silicon oxide.

12. The method of claim 10 wherein said composite layer has a thickness in the range of 70 to 200 Angstroms.

13. The method of claim 11 wherein said silicon oxide insulating layer on the polysilicon layers has a thickness in the range of 70 to 200 Angstroms.

14. The method of claim 2 wherein each of said gate electrodes is an silicon oxide layer with an overlying layer of polycrystalline silicon.

15. The method of claim 2 wherein said dopants forming source and drain regions are introduced into said substrate by ion implantation using self alignment technology.

16. The method of claim 15 wherein said dopant is as in the dosage in the range of $1 \times 10^{15}$ to $5 \times 10^{16}$ at an acceleration voltage in the range of 50 to 120 Kev.

17. The method of claim 1 wherein said second polysilicon layer is connected to a voltage source.

* * * * *